United States Patent
Kadoguchi et al.

(10) Patent No.: US 9,406,593 B2
(45) Date of Patent: Aug. 2, 2016

(54) LEAD FRAME, ELECTRIC POWER CONVERTING DEVICE, SEMICONDUCTOR APPARATUS AND METHOD OF MANUFACTURING SEMICONDUCTOR APPARATUS

(71) Applicants: Takuya Kadoguchi, Toyota (JP); Takahiro Hirano, Toyota (JP); Arata Harada, Gamagori (JP); Masayoshi Nishihata, Obu (JP); Tomomi Okumura, Anjo (JP)

(72) Inventors: Takuya Kadoguchi, Toyota (JP); Takahiro Hirano, Toyota (JP); Arata Harada, Gamagori (JP); Masayoshi Nishihata, Obu (JP); Tomomi Okumura, Anjo (JP)

(73) Assignees: Toyota Jidosha Kabushiki Kaisha, Toyota-shi, Aichi-ken (JP); Denso Corporation, Kariya-shi, Aichi-ken (JP)

( * ) Notice: Subject to any disclaimer, the term of this patent is extended or adjusted under 35 U.S.C. 154(b) by 0 days.

(21) Appl. No.: 14/314,485

(22) Filed: Jun. 25, 2014

(65) Prior Publication Data
US 2015/0028464 A1  Jan. 29, 2015

(30) Foreign Application Priority Data
Jul. 29, 2013  (JP) .................. 2013-156787

(51) Int. Cl.
*H01L 23/495* (2006.01)
*H01L 23/00* (2006.01)

(52) U.S. Cl.
CPC .... *H01L 23/49562* (2013.01); *H01L 23/49575* (2013.01); *H01L 24/89* (2013.01); *H01L 24/48* (2013.01); *H01L 24/85* (2013.01); *H01L 2224/48247* (2013.01); *H01L 2224/85001* (2013.01); *H01L 2924/13055* (2013.01); *H01L 2924/13091* (2013.01); *H01L 2924/181* (2013.01)

(58) Field of Classification Search
CPC ........ H01L 23/495; H01L 23/48; H01L 23/52
See application file for complete search history.

(56) References Cited

U.S. PATENT DOCUMENTS

| 2002/0020906 A1* | 2/2002 | Hirasawa ............. H01L 25/167 257/686 |
| 2003/0020148 A1 | 1/2003 | Kiyohara |
| 2010/0052125 A1* | 3/2010 | Sasaki .................. B23K 20/005 257/676 |

FOREIGN PATENT DOCUMENTS

| JP | 2002-222909 | 8/2002 |
| JP | 2003-46051 | 2/2003 |
| JP | 2008-218455 | 9/2008 |
| JP | 2011-176030 | 9/2011 |

* cited by examiner

*Primary Examiner* — Daniel Luke
*Assistant Examiner* — Khatib Rahman
(74) *Attorney, Agent, or Firm* — Finnegan, Henderson, Farabow, Garrett & Dunner, LLP

(57) ABSTRACT

According to the disclosure, a lead frame is provided, which includes: a first island and a second island that are arranged side by side; an outer peripheral frame; first leads that extend in a second direction perpendicular to the first direction; second leads that extend in the second direction; a first coupling portion that couples the first leads to the frame; a second coupling portion that couples the second leads to the frame; an intermediate portion formed between the first and second coupling portions in the first direction such that it extends in the second direction to terminate before the space between the first and second islands; and a deformation restraining portion formed or provided in at least one of the first leads, the second leads, the first and the second coupling portions and configured to restrain deformations of the first and second leads during a molding process.

8 Claims, 8 Drawing Sheets

US 9,406,593 B2

LEAD FRAME, ELECTRIC POWER CONVERTING DEVICE, SEMICONDUCTOR APPARATUS AND METHOD OF MANUFACTURING SEMICONDUCTOR APPARATUS

FIELD

This disclosure is related to a lead frame, an electric power converting device, a semiconductor apparatus and method of manufacturing a semiconductor apparatus.

BACKGROUND

A known lead frame is configured such that a lead frame body includes an island on which semiconductor chips are mounted; leads connected to the semiconductor chips via boding wires; and tie bars for connecting the island and the leads to the lead frame body (see Patent Document 1: Japanese Laid-open Patent Publication No. 2008-218455, for example). The lead frame has a reinforcing protrusion part formed at a periphery of the lead frame body so that the lead frame body does not actually deform even when such a force that otherwise would deform the lead frame body is applied at the time of handling the lead frame, etc. Further, FIG. 21 in Patent Document 1 disclose a lead frame which includes a lead frame body in which islands and lead groups are provided in groups of three.

According to the configuration disclosed in Patent Document 1 (FIG. 21, in particular), intermediate portions that connect the respective lead groups are formed such that they pass between the islands to connect two opposite sides of the periphery of the lead frame body. Thus, according to the configuration disclosed in Patent Document 1, because of the existence of such intermediate portions, there is a problem that the distances between the islands need to be set such that necessary isolation distances are ensured between the islands and the intermediate portions, which prevents a downsizing of the lead frame and thus a semiconductor apparatus.

SUMMARY

According to one aspect of this disclosure, a lead frame is provided, which includes:
- a first island and a second island that are arranged side by side via a predetermined space in a first direction;
- an outer peripheral frame;
- a plurality of first leads that extend in a second direction perpendicular to the first direction such that the first leads are arranged side by side in the first direction, wherein each of the first leads has an external connection end at one end in the second direction and a semiconductor element connection end for connecting to a semiconductor element at the other end in the second direction;
- a plurality of second leads that extend in the second direction such that the second leads are arranged side by side in the first direction, wherein each of the second leads has an external connection end at one end in the second direction and a semiconductor element connection end for connecting to a semiconductor element at the other end in the second direction;
- a first coupling portion that couples the first leads to the outer peripheral frame such that the first coupling portion crosses the first leads;
- a second coupling portion that couples the second leads to the outer peripheral frame such that the second coupling portion crosses the second leads;
- an intermediate portion that is formed between the first and second coupling portions in the first direction such that the intermediate portion couples the first coupling portion to the second coupling portion, wherein the intermediate portion extends in the second direction to terminate before the predetermined space between the first and second islands; and
- a deformation restraining portion configured to restrain deformations of the first and second leads during a molding process, wherein the deformation restraining portion is formed or provided in at least one of the first leads, the second leads, the first coupling portion and the second coupling portion.

DESCRIPTION OF EMBODIMENTS

In the following, embodiments are described in detail with reference to appended drawings.

Figure 1:
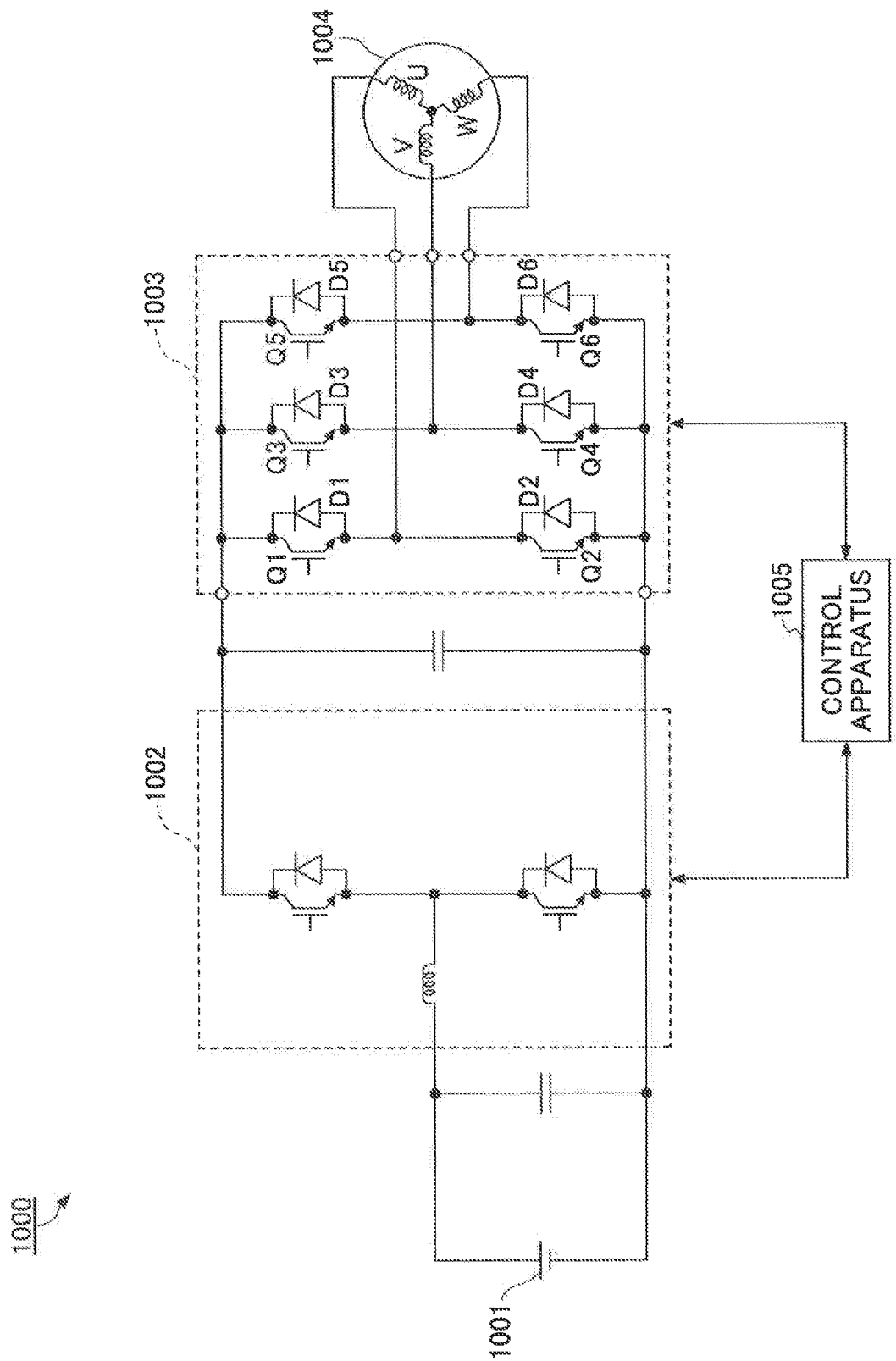
FIG. 1 is a diagram for illustrating an overview of an example of a motor drive system 1000 for an electric vehicle.

Here, at first, a motor drive system for an electric vehicle is described. FIG. 1 is a diagram for illustrating a overview of an example of a motor drive system 1000 for an electric vehicle. The motor drive system 1000 is a system for driving a motor 1004 for driving a vehicle using power from a battery 1001. It is noted that a type of the electric vehicle or a detailed configuration of the electric vehicle may be arbitrary as long as the electric vehicle is driven with a motor 1004 using electric power. Typically, the electric vehicle includes a hybrid vehicle (HV) which uses an internal combustion engine and the motor 1004 as a power source and a genuine electric vehicle which uses the motor 1004 only as a power source.

The motor drive system 1000 includes the battery 1001, a DC-DC converter 1002, an inverter 1003, the motor 1004 and a control apparatus 1005, as shown in FIG. 1.

The battery 1001 is an arbitrary capacitor cell which accumulates power to output a direct-voltage. The battery 1001 may be configured by a nickel hydrogen battery, a lithium ion battery or a capacitive element such as an electrical double layer capacitor, etc.

The DC-DC converter 1002 may be a bidirectional DC-DC converter (a reversible chopper type DC-DC converter).

The inverter 1003 includes arms of U-W-W phases disposed in parallel between a positive side line and the negative side line. The U-phase arm includes switching elements (IGBT: Insulated Gate Bipolar Transistor, in this example) Q1 and Q2 connected in series, the V-phase arm includes switching elements (IGBT in this example) Q3 and Q4 connected in series and W-phase arm includes switching elements (IGBT in this example) Q5 and Q6 connected in series. Further, diodes (free wheel diodes, for example) D1-D6 are provided between a collector and an emitter of each switching element Q1-Q6, respectively. It is noted that the switching elements Q1-Q6 may be transistors other than IGBTs, such as MOSFETs (metal oxide semiconductor field-effect transistor), etc.

The motor 1004 is a three-phase permanent-magnetic motor and one end of each coil of the U, V and W phases is commonly connected at a midpoint therebetween. It is noted that a way of connecting three coils of U, V and W phases may be a delta connection. It is noted that, in addition to the motor 1004, a second motor for driving a vehicle or a generator may be added in parallel with respect to the motor 1004. In this case, a corresponding inverter may be added in parallel.

The control apparatus 1005 controls the DC-DC converter 1002 and the inverter 1003. A way of controlling the DC-DC converter 1002 and the inverter 1003 may be arbitrary.

Figure 2:
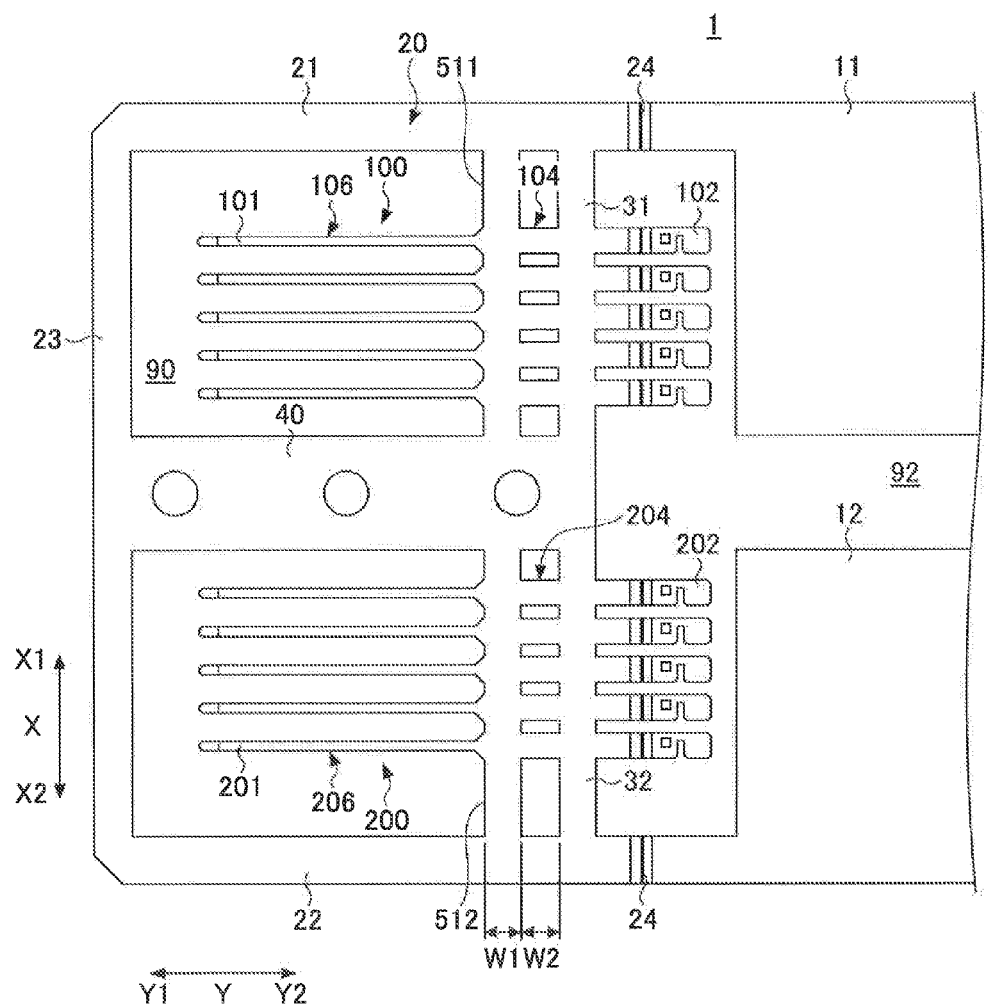
FIG. 2 is a plane view for schematically illustrating a configuration of a lead frame 1 according to an embodiment (a first embodiment).

FIG. 2 is a plane view for schematically illustrating a configuration of a lead frame 1 according to an embodiment (a first embodiment). An X-direction and a Y-direction which are perpendicular to each other as disclosed in FIG. 2 are used for the explanation hereinafter. Further, as an example, hereinafter it is assumed that the lead frame 1 forms upper and lower arms of the U phase of the inverter 1003. However, the lead frame 1 may be used to form upper and lower arms of other phases of the inverter 1003 or upper and lower arms of the DC-DC converter 1002 described above as well as other semiconductor apparatuses. It is noted that, in the case of forming the inverter 1003 described above, three inverters 1003 described above may be used to form the upper and lower arms of three phases.

The lead frame 1 includes a first island 11, a second island 12, an outer peripheral frame 20, first leads 100, second leads 200, a first coupling portion 31, a second coupling portion 32, an intermediate portion 40, a first deformation restraining portion 511, and a second deformation restraining portion 512. It is noted that the lead frame 1 may include portions with different thicknesses. In this case, a thick portion with a relatively great thickness may form the first and second islands 11 and 12, and a thin portion with a relatively small thickness may form other portions. Alternatively, a part of the outer peripheral frame 20 may be formed by the thick portion. In a typical case, a ratio of the thickness between the thick portion and the thin portion is 4:1. However, the thick portion may have a thickness which is greater than four times of the thickness of the thin portion in order to increase a heat sink function.

The first and second islands 11 and 12 may be disposed side by side via a predetermined space (clearance) 92. Semiconductor elements are mounted on the first and second islands 11 and 12, respectively. In this example, the IGBT and the diode (free wheel diode) that form the upper arm of the U phase of the inverter 1003 are mounted on the first island 11, and the IGBT and the diode that form the lower arm of the U phase of the inverter 1003 are mounted on the second island 12. It is noted that, in the example illustrated in FIG. 2, the first and second islands 11 and 12 are arranged side by side in the X-direction without any offset in the Y-direction; however, the first and second islands 11 and 12 may be arranged side by side in the X-direction with an offset in the Y-direction.

The outer peripheral frame 20 forms an outer peripheral frame of the lead frame 1, and may have functions of ensuring necessary rigidity of the lead frame 1 as well as holding (suspending) the first leads 100, etc. A detailed shape of the outer peripheral frame 20 may be arbitrary. It is noted that, in the example illustrated in FIG. 2, the outer peripheral frame 20 is formed on a Y1 side in the Y-direction with respect to the first and second islands 11 and 12. Specifically, the outer peripheral frame 20 includes a first lateral portion 21, a second lateral portion 22 and a longitudinal portion 23. The first lateral portion 21 extends from an end of the first island 11 on an X1 side in the X-direction to the Y1 side. The second lateral portion 22 extends from an end of the second island 12 on an X2 side in the X-direction to the Y1 side. The longitudinal portion 23 extends in the X-direction to couple an end of the first lateral portion 21 and an end of the second lateral portion 22. The first and second lateral portions 21 and 22 and the longitudinal portion 23 define, in cooperation with the first and second islands 11 and 12, a substantially closed opening 90. However, a space 92 is formed between the first and second islands 11 and 12. The outer peripheral frame 20 may be formed on a Y2 side in the Y-direction with respect to the first and second islands 11 and 12. In this case, the first and second islands 11 and 12 may be coupled to the outer peripheral frame 20 on the Y2 side as well. Further, in the example illustrated in FIG. 2, the first and second lateral portions 21 and 22 have steps 24 via which the first and second lateral portions 21 and 22 are connected to the first and second islands 11 and 12, respectively.

The first leads 100 are disposed side by side in the X-direction. The first leads 100 each extend in the Y-direction. The first leads 100 each include an external connection end 101 on the Y1 side in the Y-direction, and a semiconductor element connection end 102 on the Y2 side in the Y-direction. It is noted that, in the example illustrated in FIG. 2, the first leads 100 each include a wide portion 104 on the Y2 side in the Y-direction that has a relatively great width in the X-direction, and a narrow portion 106 on the Y1 side in the Y-direction that has a relatively small width in the X-direction. However, the first leads 100 each may have a constant width or a width that varies in a different way. It is noted that the external connection ends 101 may be formed on ends of the narrow portions 106. The first leads 100 may be plated by nickel plating, etc., for example. Further, the external connection ends 101 may be specially plated by gold plating, etc., for example.

It is noted that, in the example illustrated in FIG. 2, the first leads 100 are disposed next to the first island 11 on the Y1 side in the Y-direction with respect to the first island 11. However, the first leads 100 may be disposed such that the first leads 100 have an offset in the X-direction with respect to the first island 11. Further, in the example illustrated in FIG. 2, the first leads 100 each are arranged side by side in the X-direction without any offset in the Y-direction; however, the first leads 100 each may be arranged side by side in the X-direction with an offset in the Y-direction.

The second leads 200 are disposed side by side in the X-direction. The second leads 200 each extend in the Y-direction. The second leads 200 each includes an external connection end 201 on the Y1 side in the Y-direction, and a semiconductor element connection end 202 on the Y2 side in the Y-direction. It is noted that, in the example illustrated in FIG. 2, the second leads 200 each include a wide portion 204 on the Y2 side in the Y-direction that has a relatively great width in the X-direction, and a narrow portion 206 on the Y1 side in the Y-direction that has a relatively small width in the X-direction. However, the second leads 200 each may have a constant width or a width that varies in a different way. It is noted that the external connection ends 201 may be formed on ends of the narrow portions 206. The second leads 200 may be plated by nickel plating, etc., for example. Further, the external connection ends 201 may be specially plated by gold plating, etc., for example.

It is noted that, in the example illustrated in FIG. 2, the second leads 200 are disposed next to the second island 12 on the Y1 side in the Y-direction with respect to the second island 12. However, the second leads 200 may be disposed such that the second leads 200 have an offset in the X-direction with respect to the second island 12. Further, the second leads 200 and the first leads 100 are disposed side by side in the X-direction. However, the second leads 200 and the first leads 100 may be disposed side by side in the X-direction such that the second leads 200 have an offset in the Y-direction with respect to the first leads 100. Further, in the example illustrated in FIG. 2, the second leads 200 each are arranged side by side in the X-direction without any offset in the Y-direction; however, the second leads 200 each may be arranged side by side in the X-direction with an offset in the Y-direction.

The first coupling portion 31 crosses the first leads 100 to couple the first leads 100 to the outer peripheral frame 20. In other words, the first coupling portion 31 functions as a tie bar for suspending the first leads 100 with respect to the outer peripheral frame 20. In the example illustrated in FIG. 2, the first coupling portion 31 extends from the first lateral portion 21 in a direction parallel to the X-direction such that the first coupling portion 31 couples between the wide portions 104 of the first leads 100 and couples to the intermediate portion 40 described hereinafter. It is noted that the first coupling portion 31 may be formed on the Y1 side in the Y-direction with respect to the step 24 of the first lateral portion 21.

The second coupling portion 32 crosses the second leads 200 to couple the second leads 200 to the outer peripheral frame 20. In other words, the second coupling portion 32 functions as a tie bar for suspending the second leads 200 with respect to the outer peripheral frame 20. In the example illustrated in FIG. 2, the second coupling portion 32 extends from the second lateral portion 22 in a direction parallel to the X-direction such that the second coupling portion 32 couples between the wide portions 204 of the second leads 200 and couples to the intermediate portion 40 described hereinafter. It is noted that the first coupling portion 32 may be formed on the Y1 side in the Y-direction with respect to the step 24 of the first lateral portion 22.

It is noted that, in the example illustrated in FIG. 2, the first and second coupling portions 31 and 32 don't have an offset in the Y-direction with respect to each other such that the first and second coupling portions 31 and 32 extend in a straight line as a whole; however, the first and second coupling portions 31 and 32 may have an offset in the Y-direction.

The intermediate portion 40 is formed between the first and second coupling portions 31 and 32 to couple to the first and second coupling portions 31 and 32. An extension (existing range on the Y2 side in the Y-direction) of the intermediate portion 40 in the Y-direction ends before the space 92 between the first and second islands 11 and 12. In other words, the intermediate portion 40 is formed in the Y-direction such that the intermediate portion 40 does not extend into (enter) the space 92 between the first and second islands 11 and 12. With this arrangement, the distance (in the X-direction) between the first and second islands 11 and 12 can be reduced and the lead frame 1 (and thus the inverter 1003 that is formed by the lead frame 1) can be downsized. In other words, if the intermediate portion 40 extends into the space 92 between the first and second islands 11 and 12, it becomes necessary to increase the distance between the first and second islands 11 and 12 so as to ensure insulation between the first and second islands 11 and 12 and the intermediate portion 40 (and between the semiconductor element connection ends 102, 202 and the intermediate portion 40). In contrast, in the example illustrated in FIG. 2, because the intermediate portion 40 does not extend between the first and second islands 11 and 12, it becomes possible to minimize the distance between the first and second islands 11 and 12 and thus downsize the lead frame 1. In the example illustrated in FIG. 2, the intermediate portion 40 is not formed on the Y2 side in the Y-direction with respect to the first and second coupling portions 31 and 32 such that the intermediate portion 40 on the Y2 side in the Y-direction terminates between first and second coupling portions 31 and 32. Thus, it is substantially unnecessary to take care of the insulation between the semiconductor element connection ends 102, 202 and the intermediate portion 40.

It is noted that such a configuration as described above in which the intermediate portion 40 on the Y2 side in the Y-direction does not pass between the first and second islands 11 and 12 (and thus the intermediate portion 40 on the Y2 side in the Y-direction is not suspended by the outer peripheral frame 20) is referred to as "cantilever configuration", hereinafter.

The intermediate portion 40 on the Y1 side in the Y-direction need not extend to the outer peripheral frame 20; however, preferably the intermediate portion 40 on the Y1 side in the Y-direction couples to the outer peripheral frame 20, as illustrated in FIG. 2. With this arrangement, the rigidity of the outer peripheral frame 20 increases and the deformation of the outer peripheral frame 20 (and thus the deformation of the first and second leads 100 and 200) can be reduced. It is noted that, in the example illustrated in FIG. 2, the intermediate portion 40 has a width in the X-direction that is substantially equal to the distance in the X-direction between the first and second islands 11 and 12, and extends in a direction parallel to the Y-direction.

The first deformation restraining portion 511 has a function of restraining deformations of the first leads 100 during a molding process (this deformation restraining function is described in detail, hereinafter). The first deformation restraining portion 511 crosses the first leads 100 to couple the first leads 100 to the outer peripheral frame 20. In other words, the first deformation restraining portion 511 functions as a tie bar for suspending the first leads 100 with respect to the outer peripheral frame 20, as is the case with the first coupling portion 31. In the example illustrated in FIG. 2, the first deformation restraining portion 511 extends from the first lateral portion 21 in a direction parallel to the X-direction such that the first deformation restraining portion 511 couples between the wide portions 104 of the first leads 100 and couples to the intermediate portion 40. It is noted that the first deformation restraining portion 511 may be formed on the Y1 side in the Y-direction with respect to the first coupling portion 31.

The second deformation restraining portion 512 has a function of restraining deformations of the second leads 200 during the molding process (this deformation restraining function is described in detail, hereinafter). The second deformation restraining portion 512 crosses the second leads 200 to couple the second leads 200 to the outer peripheral frame 20. In other words, the second deformation restraining portion 512 functions as a tie bar for suspending the second leads 200 with respect to the outer peripheral frame 20, as is the case with the second coupling portion 32. In the example illustrated in FIG. 2, the second deformation restraining portion 512 extends from the second lateral portion 22 in a direction parallel to the X-direction such that the second deformation restraining portion 512 couples between the wide portions 204 of the second leads 200 and couples to the intermediate portion 40. It is noted that the second deformation restraining portion 512 may be formed on the Y1 side in the Y-direction with respect to the second coupling portion 32.

It is noted that, in the example illustrated in FIG. 2, the first and second deformation restraining portions 511 and 512 don't have an offset in the Y-direction with respect to each other such that the first and second deformation restraining portions 511 and 512 extend in a straight line as a whole; however, the first and second deformation restraining portions 511 and 512 may have an offset in the Y-direction.

Figure 3:
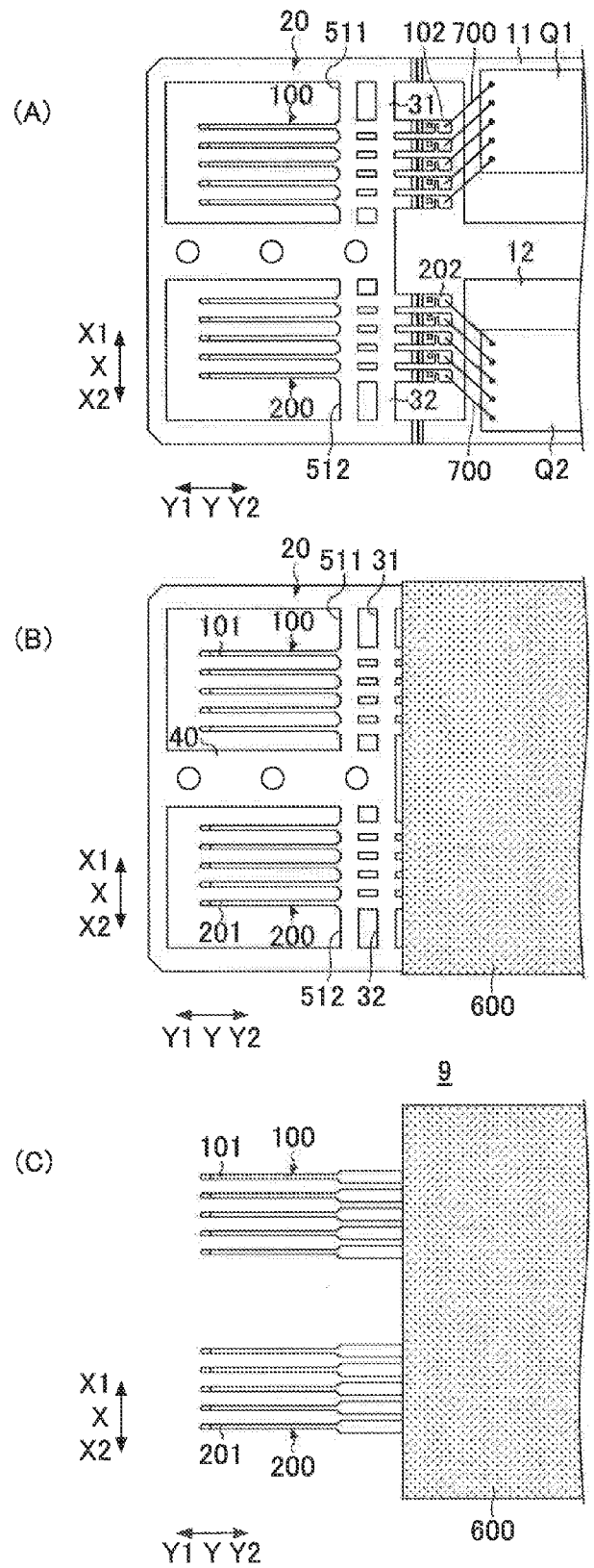
FIG. 3 is a diagram for explaining an example of a way of manufacturing an inverter 1003.

Next, a way of manufacturing the inverter 1003 using the lead frame 1 is described. FIG. 3 is a diagram for explaining an example of a way of manufacturing the inverter 1003.

At first, the lead frame illustrated in FIG. 2 is provided, and then the IGBT and the diode (free wheel diode) are installed on the first and second islands 11 and 12 of the lead frame 1, respectively. It is noted that the IGBT and the diode may be mounted on the first and second islands 11 and 12 of the lead frame 1, respectively, by soldering or the like. In FIG. 3 (A), for the sake of convenience for the explanation, only the switching elements Q1 and Q2 which are IGBTs mounted on the first and second islands 11 and 12 of the lead frame 1, respectively, are illustrated. The diodes may be installed on the Y2 side in the Y-direction with respect to the IGBTs.

Then, as illustrated in FIG. 3 (A), the semiconductor element connection ends 102 of the first leads 100 are connected to the switching element Q1, by bonding wires 700, for example, and the semiconductor element connection ends 202 of the second leads 200 are connected to the switching element Q2, by bonding wires 700, for example. It is noted that the first leads and the second leads 200 becomes leads for transmitting gate signals (driving signals for the switching elements Q1 and Q2), signals related to sense emitters (for detecting excessive current) that may be incorporated in the switching elements Q1 and Q2, signals related to temperature sensors, etc. Other processes, which are not illustrated, such as other connections of the switching elements Q1 and Q2 (connections between emitters of the switching elements Q1 and Q2 and anodes of the diodes D1 and D2, respectively, for example) may be performed. Further, prior to a subsequent resin molding process, the lead frame 1 may be provided on a heat sink or the like via an insulation body.

Then, as illustrated in FIG. 3 (B), a resin is molded on the lead frame 1 such that the external connection ends 101 of the first leads and the external connection end 201 of the second leads are exposed to the outside (a resin molding process). In other words, the semiconductor element connection ends 102 and 203, the switching elements Q1 and Q2, etc., are sealed by the resin. As a result of this, as illustrated in FIG. 3 (B), a resin mold portion 600 is formed on the lead frame 1.

Then, as illustrated in FIG. 3 (C), a part of the outer peripheral frame 20 that is exposed from the resin mold portion 600, the first coupling portion 31, the second coupling portion 32, the intermediate portion 40, the first deformation restraining portion 511, and the second deformation restraining portion 512 are cut away. As a result of this, a configuration in which only the first and second leads 100 and 200 are exposed from the resin mold portion 600 is obtained. Further, the first and second leads 100 and 200 may be subject to a forming process to have their final shapes. In this way, an electric power converting device 9 is formed. Then, although it is not illustrated, the external connection ends 101 of the first leads 100 and the external connection ends 201 of the second leads 200 may be connected to a control substrate that implements the control apparatus 1005.

It is noted that, in the example illustrated in FIG. 3, only the first and second leads 100 and 200 are exposed from the resin mold portion 600; however, other portions may be exposed if necessary. For example, if a part of the portion of the outer peripheral frame 20 exposed from the resin mold portion 600 is utilized to form a lead portion for a voltage sensor, the part may be remained (exposed) without being cut away.

When such a resin molding process as illustrated in FIG. 3 (C) is performed, the lead frame 1 is pressed down by a die. Typically, the first coupling portion 31, the second coupling portion 32, the opposite ends of the intermediate portion 40 in the Y-direction, etc., are pressed down by the die so that the resin molding process is performed in a status where the lead frame 1 is stationary (fixed). At that time, a force is applied the lead frame 1 when the lead frame 1 is pressed down by the die. Therefore, it is desirable that the lead frame 1 is formed such that no harmful deformation occurs at the time of the resin molding process.

Figure 4:
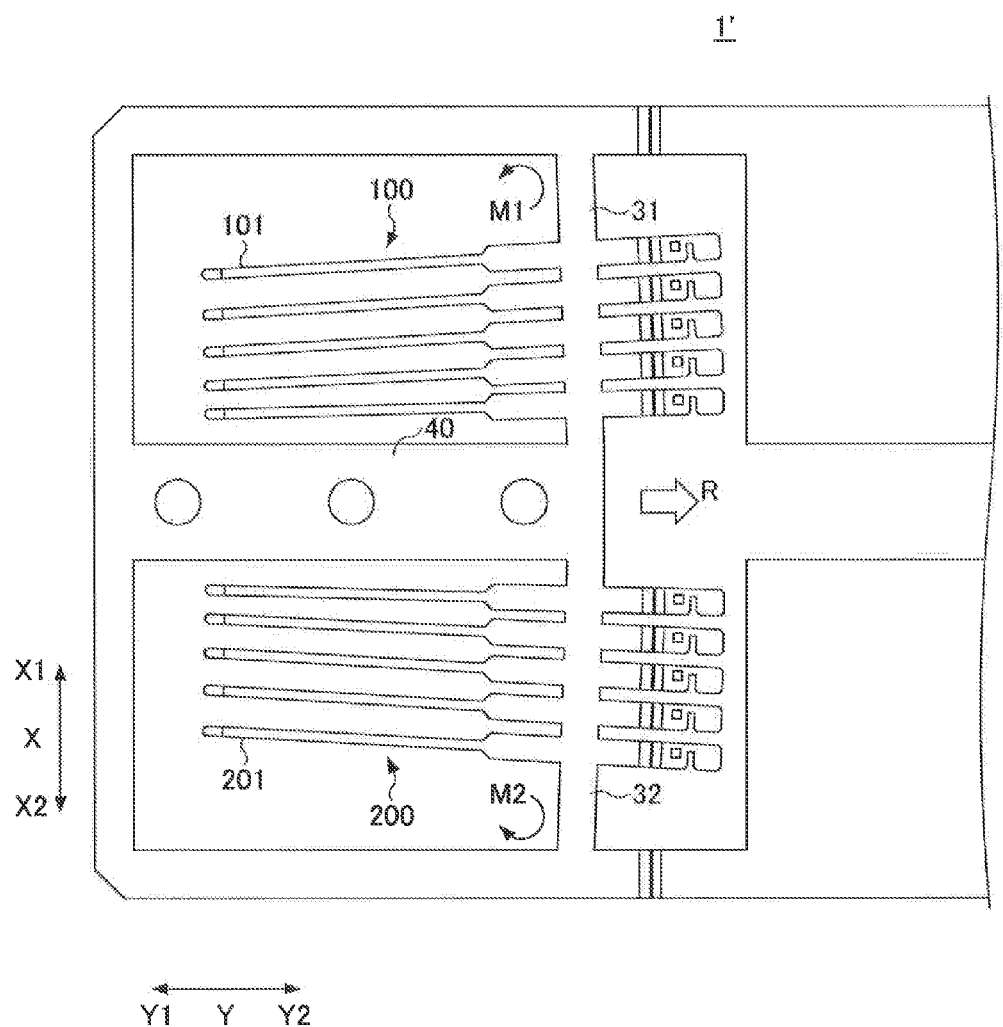
FIG. 4 is a diagram for schematically illustrating a deformed status of a lead frame 1' according to a comparative example during a resin molding process.

FIG. 4 is a diagram for schematically illustrating a deformed status of a lead frame 1' according to a comparative example during a resin molding process. The comparative example differs from the first embodiment described above in that it does not include the first deformation restraining portion 511 and the second deformation restraining portion 512.

When the lead frame 1' is pressed down by the die at the time of the resin molding process, rotation moments M1 and M2 are applied to the lead frame 1'. This is because the outer peripheral frame 20 is pressed down strongly by the die at a portion which is adjacent to the end of the first coupling portion 31 on the X1 side and portion which is adjacent to the end of the second coupling portion 32 on the X2 side, in particular, while the intermediate portion 40 is not constrained on the Y2 side due to the cantilever configuration described above. Thus, as indicated by an arrow R in FIG. 4, the intermediate portion 40 is deformed (displaced) toward the Y2 side, and the first leads 100 and the second leads 200 are deformed such that the first leads 100 and the second leads 200 come closer to each other on the side of the external connection ends 101, as illustrated in FIG. 4.

In contrast, according to the first embodiment described above, such deformations can be reduced because the first deformation restraining portion 511 and the second deformation restraining portion 512 are provided. Specifically, according to the first embodiment, because the first deformation restraining portion 511 and the second deformation restraining portion 512 are provided, overall bending rigidity of the first deformation restraining portion 511, the second deformation restraining portion 512, the first coupling portion 31 and the second coupling portion 32 are increased, which reduces the displacement of the intermediate portion 40 to the Y2 side. Further, thanks to a clearance between the first deformation restraining portion 511 and the first coupling portion 31 and a clearance between the second deformation restraining portion 512 and the second coupling portion 32, the deformations of the first and second leads 100 and 200 are absorbed on the Y2 side with respect to the first deformation restraining portion 511 and the second deformation restraining portion 512, which reduces the deformations of the first and second leads 100 and 200 on the side of the external connection ends 101 and 201. It is noted that a CAE (Computer-Aided Engineering) analysis performed by the inventors proved that the deformation amounts are reduced by about 80 percent with respect to the comparative example. In particular, when a sum (=W1+W2) of a width W1 (see FIG. 2) in the Y-direction of the first deformation restraining portion 511 and the second deformation restraining portion 512 and a width W2 in Y-direction of a clearance between the first and the second deformation restraining portions 511 and 512 and the first and second coupling portions 31 and 32 is greater than 4 mm, the deformation amounts can be reduced with increased robustness.

It is noted that in the first embodiment described above, the first and the second deformation restraining portions 511 and 512 are formed such that the first and the second deformation restraining portions 511 and 512 crosses the wide portions 104 and 204 of the first and second leads 100 and 200, respectively. However, the first and the second deformation restraining portions 511 and 512 may be formed such that they cross any portions of the first and second leads 100 and 200, respectively, as long as the first and the second deformation restraining portions 511 and 512 are formed on the Y1 side with respect to the first and second coupling portions 31 and 32, respectively. In this connection, ultimately, the first and the second deformation restraining portions 511 and 512 may be formed integrally with the first and second coupling portions 31 and 32 (i.e., the clearance W2=0), respectively. Further, the first and the second deformation restraining portions 511 and 512 may be formed across the external connection ends 101 and 201 (tip portions on the Y1 side, for example) of the first and second leads 100 and 200, respectively. However, if the first and the second deformation restraining portions 511 and 512 are formed across the external connection ends 101 and 201 of the first and second leads 100 and 200, respectively, the plating (gold plating, for example) may come off such that a surface under the plating is exposed at the time of cutting the first and the second deformation restraining portions 511 and 512 after the resin molding process. In this case, a reliability of the electric connection at the external connection ends 101 and 201 may be reduced. Thus, preferably, the first and the second deformation restraining portions 511 and 512 are formed across portions other than the external connection ends 101 and 201 of the first and second leads 100 and 200, respectively.

Figure 5:
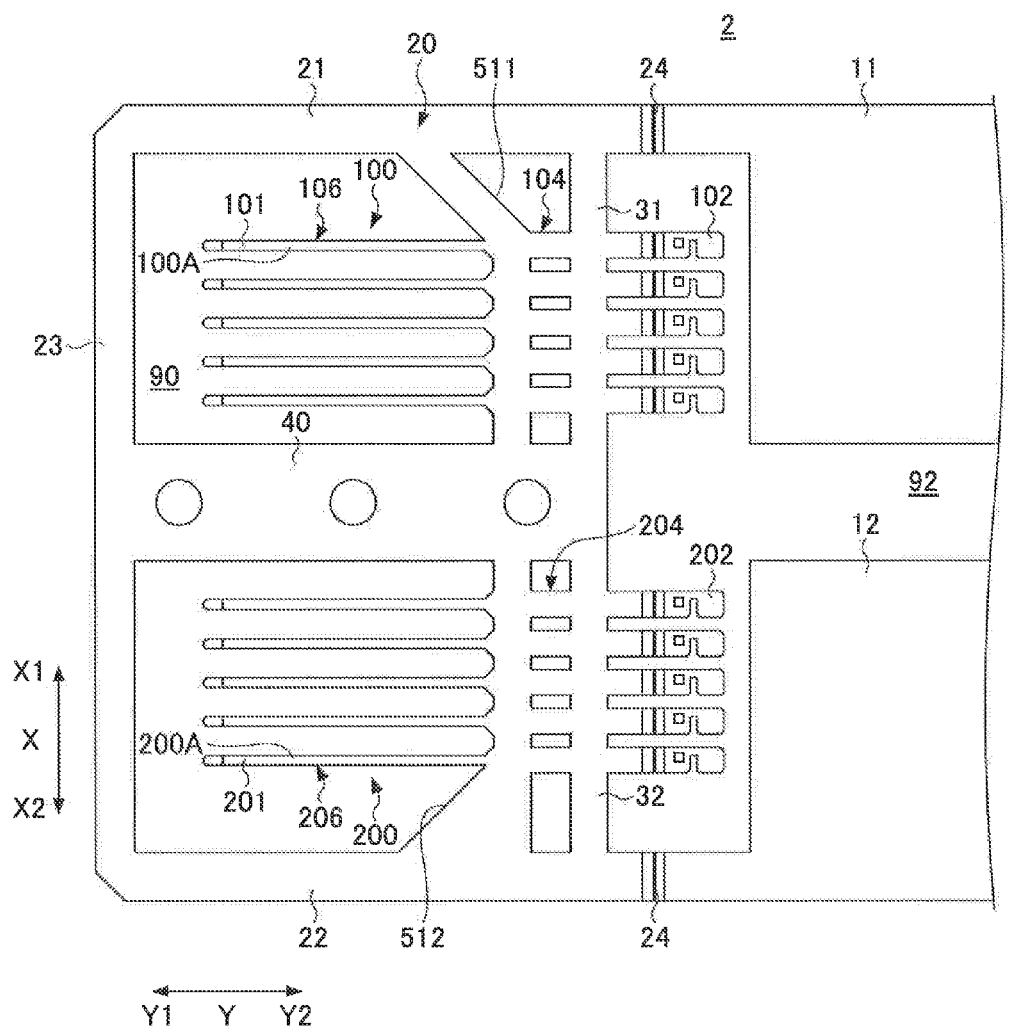
FIG. 5 is a plane view for schematically illustrating a configuration of a lead frame 2 according to another embodiment (a second embodiment).

FIG. 5 is a plane view for schematically illustrating a configuration of a lead frame 2 according to another embodiment (a second embodiment). The second embodiment differs from the first embodiment described above in the configurations of the first and the second deformation restraining portions 511 and 512. Other configurations in the second embodiment may be the same as those in the first embodiment described above.

Specifically, according to the second embodiment, the first deformation restraining portion 511 extends in an inclined direction between the outer peripheral frame 20 and the outermost first lead 100A of the first leads 100 on the X1 side. In other words, the first deformation restraining portion 511 extends straightly in a direction parallel to the X-direction between the intermediate portion 40 and the outermost first lead 100A of the first leads 100 on the X1 side, while the first deformation restraining portion 511 is inclined between the outer peripheral frame 20 and the outermost first lead 100A such that the first deformation restraining portion 511 on the side of the outer peripheral frame 20 is directed to the Y1 side. Also in this case, substantially the same effects as the first embodiment described above can be obtained.

Further, according to the second embodiment, the second deformation restraining portion 512 has such a width in the Y-direction between the outer peripheral frame 20 and the outermost second lead 200A of the second leads 200 on the X2 side that the width gradually becomes greater as the second deformation restraining portion 512 comes closer to the outer peripheral frame 20. In other words, the second deformation restraining portion 512 extends straight in a direction parallel to the X-direction between the intermediate portion 40 and the outermost second lead 200A of the second leads 200 on the X2 side, while the second deformation restraining portion 512 has such a width in the Y-direction between the outer peripheral frame 20 and the outermost second lead 200A that the width gradually becomes greater as the second deformation restraining portion 512 comes closer to the outer peripheral frame 20. Also in this case, substantially the same effects as the first embodiment described above can be obtained.

It is noted that, in the second embodiment, the respective configurations of the first and the second deformation restraining portions 511 and 512 are different; however, they may be the same. In other words, in the second embodiment, the first deformation restraining portion 511 may have the same configuration as the second deformation restraining portion 512 according to the second embodiment. Alternatively, in the second embodiment, the second deformation restraining portion 512 may have the same configuration as the first deformation restraining portion 511 according to the second embodiment. Further, the second deformation restraining portion 512 has the width in the Y-direction that increases linearly as a position on the second deformation restraining portion 512 changes from the outermost second lead 200A to the outer peripheral frame 20; however, the width in the Y-direction may increase non-linearly.

Figure 6:
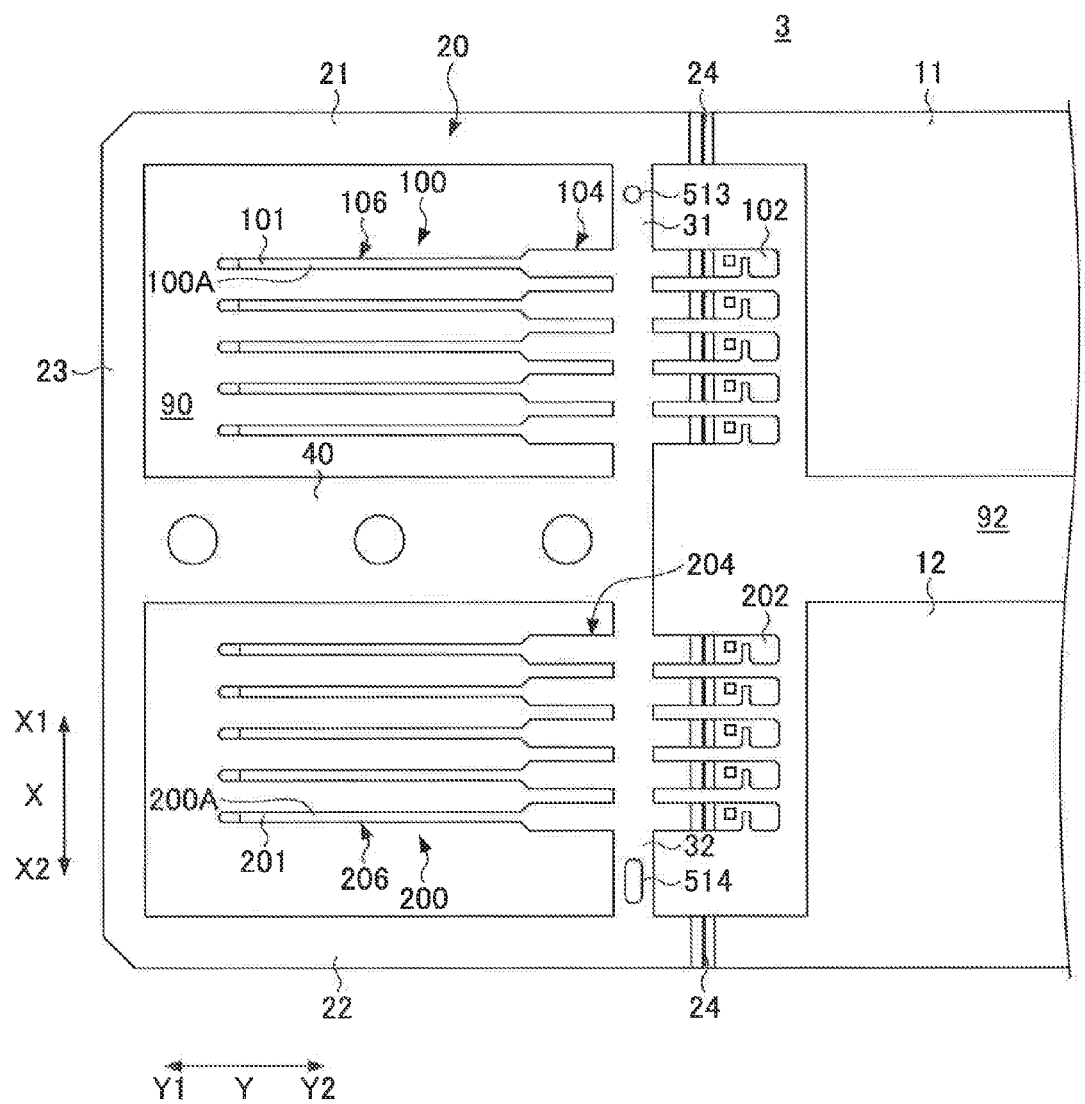
FIG. 6 is a plane view for schematically illustrating a configuration of a lead frame 3 according to yet another embodiment (a third embodiment).

FIG. 6 is a plane view for schematically illustrating a configuration of a lead frame 3 according to yet another embodiment (a third embodiment). The third embodiment differs from the first embodiment described above in the configurations of the first and the second deformation restraining portions. Other configurations in the third embodiment may be the same as those in the first embodiment described above.

Specifically, according to the third embodiment, the first and the second deformation restraining portions 511 and 512 in a form of a tie bar are omitted, and, instead of it, first and second deformation restraining portions 513 and 514 in a form of a hole are provided.

The first deformation restraining portion 513 is formed in the first coupling portion 31 between the outer peripheral frame 20 and the outermost first lead 100A of the first leads 100 on the X1 side, as illustrated in FIG. 6. In other words, the first deformation restraining portion 513 is not formed in the first coupling portion 31 between the intermediate portion 40 and the outermost first lead 100A so that the first deformation restraining portion 513 is formed only in an end portion of the first coupling portion 31 on the X1 side.

The second deformation restraining portion 514 is formed in the second coupling portion 32 between the outer peripheral frame 20 and the outermost second lead 200A of the second leads 200 on the X2 side, as illustrated in FIG. 6. In other words, the second deformation restraining portion 514 is not formed in the second coupling portion 32 between the intermediate portion 40 and the outermost second lead 200A so that the second deformation restraining portion 514 is formed only in an end portion of the second coupling portion 32 on the X2 side.

According to the third embodiment, thanks to the first and second deformation restraining portions 513 and 514 in a form of a hole, the first and second deformation restraining portions 513 and 514 are locally deformed at the time of the resin molding process, which reduces the deformation of the lead frame 3 as a whole (i.e., the rotation moments M1 and M2 (see FIG. 4) are reduced). Therefore, as is the case with the first embodiment, it becomes possible to reduce the deformation of the first and second leads 100 and 200 on the side of the external connection ends 101 and 201. It is noted that a CAE analysis performed by the inventors proved that the deformation amounts are reduced by about 20 percent with respect to the comparative example.

It is noted that, in the example illustrated in FIG. 6, the first deformation restraining portion 513 is in a form of a circular hole and the second deformation restraining portion 514 is in a form of a slot that has a longitudinal direction in the X-direction; however, shapes of the holes may be arbitrary. Further, the first deformation restraining portion 513 and/or the second deformation restraining portion 514 may include a plurality of holes.

Figure 7:
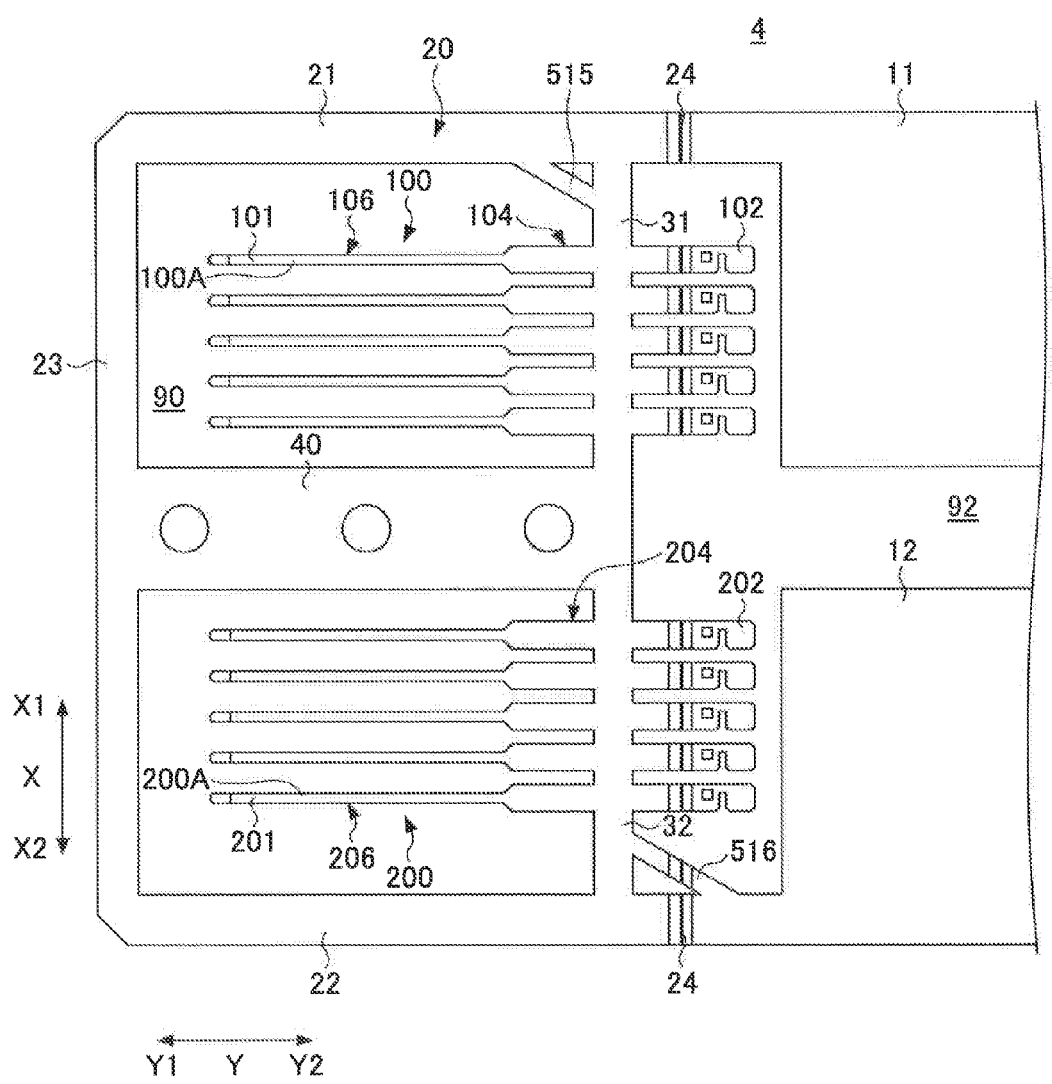
FIG. 7 is a plane view for schematically illustrating a configuration of a lead frame 4 according to yet another embodiment (a fourth embodiment).

FIG. 7 is a plane view for schematically illustrating a configuration of a lead frame 4 according to yet another embodiment (a fourth embodiment). The fourth embodiment differs from the first embodiment described above in the configurations of the first and the second deformation restraining portions. Other configurations in the fourth embodiment may be the same as those in the first embodiment described above.

Specifically, according to the fourth embodiment, the first and the second deformation restraining portions 511 and 512 in a form of a tie bar is omitted, and instead of it first and second deformation restraining portions 515 and 516 in a form of a beam (truss) are provided.

The first deformation restraining portion 515 is formed between the outer peripheral frame 20 and the outermost first lead 100A of the first leads 100 on the X1 side such that one end of the first deformation restraining portion 515 is coupled to the outer peripheral frame 20 and another end of the first deformation restraining portion 515 is coupled to the first coupling portion 31, as illustrated in FIG. 7. The first deformation restraining portion 515 may be formed on the Y1 side in the Y-direction with respect to the first coupling portion 31, illustrated in FIG. 7. The first deformation restraining portion 515 may be formed integrally with the lead frame 4, or may be formed separately from the lead frame 4 and then attached to the lead frame 4.

The second deformation restraining portion 516 is formed between the outer peripheral frame 20 and the outermost second lead 200A of the second leads 200 on the X2 side such that one end of the second deformation restraining portion 516 is coupled to the outer peripheral frame 20 and another end of the second deformation restraining portion 516 is coupled to the second coupling portion 32, as illustrated in FIG. 7. The second deformation restraining portion 516 may be formed on the Y2 side in the Y-direction with respect to the second coupling portion 32, illustrated in FIG. 7. The second deformation restraining portion 516 may be formed integrally with the lead frame 4, or may be formed separately from the lead frame 4 and then attached to the lead frame 4.

According to the fourth embodiment, thanks to the first and second deformation restraining portions 515 and 516 in a form of a beam, the bending rigidity of the first and second coupling portions 31 and 32 is increased and thus the deformation of the lead frame 3 as a whole at the time of the molding process is reduced. Therefore, according to the fourth embodiment, as is the case with the first embodiment described above, the deformations of the first and second leads 100 and 200 on the side of the external connection ends 101 and 201 can be reduced.

It is noted that, in the fourth embodiment, the respective configurations of the first and the second deformation restraining portions 515 and 516 are different; however, they may be the same. In other words, in the fourth embodiment, the first deformation restraining portion 515 may have the same configuration as the second deformation restraining portion 516 according to the fourth embodiment. Alternatively, in the fourth embodiment, the second deformation restraining portion 516 may have the same configuration as the first deformation restraining portion 515 according to the fourth embodiment. Further, a plurality of the first deformation restraining portions 515 and/or a plurality of the second deformation restraining portions 516 may be provided.

Figure 8:
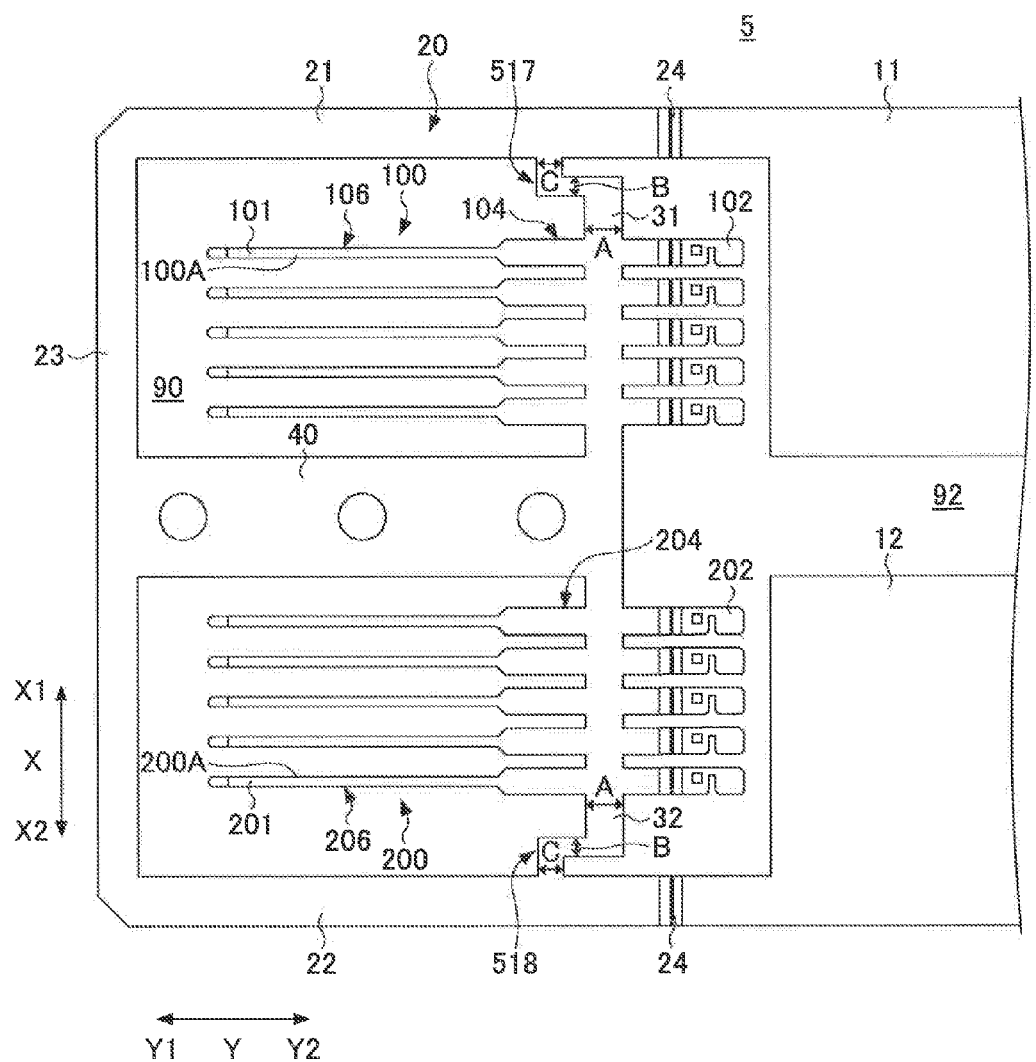
FIG. 8 is a plane view for schematically illustrating a configuration of a lead frame 5 according to yet another embodiment (a fifth embodiment).

FIG. 8 is a plane view for schematically illustrating a configuration of a lead frame 5 according to yet another embodiment (a fifth embodiment). The fifth embodiment differs from the first embodiment described above in the configurations of the first and the second deformation restraining portions. Other configurations in the fifth embodiment may be the same as those in the first embodiment described above.

Specifically, according to the fifth embodiment, the first and the second deformation restraining portions 511 and 512 in a form of a tie bar is omitted, and, instead of it, first and second deformation restraining portions 517 and 518 in a form of a bent portion are provided.

The first deformation restraining portion 517 is formed in the first coupling portion 31 such that it is bent from the X-direction to the Y-direction and then from the Y-direction to the X-direction, as illustrated in FIG. 8. Specifically, the first deformation restraining portion 517 is formed in the first coupling portion 31 between the outer peripheral frame 20 and the outermost first lead 100A of the first leads 100 on the X1 side. In other words, the first deformation restraining portion 517 is not formed in the first coupling portion 31 between the intermediate portion 40 and the outermost first lead 100A so that the first deformation restraining portion 517 is formed only in an end portion of the first coupling portion 31 on the X1 side. The width B of the first deformation restraining portion 517 in the Y-direction is smaller than the width A of the first coupling portion 31 in the Y-direction. Further, the width C of the first deformation restraining portion 517 in the X-direction may be smaller than or the same as the width A of the first coupling portion 31 in the Y-direction.

The second deformation restraining portion 518 is formed in the second coupling portion 32 such that it is bent from the X-direction to the Y-direction and then from the Y-direction to the X-direction, as illustrated in FIG. 8. Specifically, the second deformation restraining portion 518 is formed in the second coupling portion 32 between the outer peripheral frame 20 and the outermost second lead 200A of the second leads 200 on the X2 side. In other words, the second deformation restraining portion 518 is not formed in the second coupling portion 32 between the intermediate portion 40 and the outermost second lead 200A so that the second deformation restraining portion 518 is formed only in an end portion of the second coupling portion 32 on the X2 side. The width B of the second deformation restraining portion 518 in the Y-direction is smaller than the width A of the second coupling portion 32 in the Y-direction. Further, the width C of the second deformation restraining portion 518 in the X-direction may be smaller than or the same as the width A of the second coupling portion 32 in the Y-direction.

According to the fifth embodiment, thanks to the first and second deformation restraining portions 517 and 518, the first and second deformation restraining portions 517 and 518 are locally deformed at the time of the molding process (i.e., a stress is reduced at the first and second deformation restraining portions 517 and 518), which reduces the deformation of the lead frame 3 as a whole. Therefore, as is the case with the first embodiment, it becomes possible to reduce the deformation of the first and second leads 100 and 200 on the side of the external connection ends 101 and 201.

It is noted that, in the example illustrated in FIG. 8, the first and the second deformation restraining portions 517 and 518 each include a bent portion with one bending position (only one bending to the Y-direction); however, the first deformation restraining portion 517 and/or the second deformation restraining portion 518 each may include a bent portion with more than two bending positions.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention. Further, all or part of the components of the embodiments described above can be combined.

For example, in the embodiments described above, the first and the second deformation restraining portions 511 and 512, etc., are provided for the first and second leads 100 and 200, respectively, as preferred embodiments; however, only one of the first and the second deformation restraining portions 511 and 512, etc., may be provided. For example, in the example illustrated in FIG. 2, the second deformation restraining portion 512 may be omitted so that only the first deformation restraining portion 511 is provided.

Further, in the embodiments described above, such a configuration in which there are two islands (i.e., the first and second islands 11 and 12) is assumed; however, the embodiments described above can be applied to a lead frame that includes more than two islands. In this case, lead groups are similarly formed for the respective islands, and intermediate portions like the intermediate portion 40 are formed between the lead groups.

Further, according to the first and second embodiments, the first and the second deformation restraining portions 511 and 512 are formed such that they extend in a direction (i.e., the X-direction) perpendicular to the longitudinal direction (i.e., the Y-direction) of the first and second leads 100 and 200; however, the first and the second deformation restraining portions 511 and 512 may extend in an inclined direction with respect to the X-direction.

Further, in the first and second embodiments, a plurality of the first deformation restraining portions 511 and a plurality of the second deformation restraining portions 512 may be provided.

The present application is based on Japanese Priority Application No. 2013-156787, filed on Jul. 29, 2013, the entire contents of which are hereby incorporated by reference.

What is claimed is:

1. A lead frame, comprising:
a first island and a second island that are arranged side by side via a predetermined space in a first direction;
an outer peripheral frame;
a plurality of first leads that extend in a second direction perpendicular to the first direction such that the first leads are arranged side by side in the first direction, wherein each of the first leads has an external connection end at one end in the second direction and a semiconductor element connection end for connecting to a semiconductor element at the other end in the second direction, and wherein the external connection end of each of the first leads is a free end separated from the other external connection ends of the first leads before resin for covering the lead frame has been formed;
a plurality of second leads that extend in the second direction such that the second leads are arranged side by side in the first direction, wherein each of the second leads has an external connection end at one end in the second direction and a semiconductor element connection end for connecting to a semiconductor element at the other end in the second direction, and wherein the external connection end of each of the second leads is a free end separated from the other external connection ends of the second leads before resin for covering the lead frame has been formed;
a first coupling portion that couples the first leads to the outer peripheral frame such that the first coupling portion crosses the first leads;
a second coupling portion that couples the second leads to the outer peripheral frame such that the second coupling portion crosses the second leads;
an intermediate portion that is formed between the first and second coupling portions in the first direction such that the intermediate portion couples the first coupling portion to the second coupling portion, wherein the intermediate portion extends in the second direction to terminate before the predetermined space between the first and second islands; and
a deformation restraining portion configured to restrain deformations of the first and second leads during a molding process, wherein the deformation restraining portion is formed or provided in at least one of the first leads, the second leads, the first coupling portion and the second coupling portion.

2. The lead frame of claim 1, wherein the deformation restraining portion restrains a deformation mode in which the first leads and the second leads deform in such a direction that a distance between the first leads and the second leads in the first direction on a side of the external connection ends becomes shorter.

3. The lead frame of claim 1, wherein the intermediate portion has one end in the second direction coupled to the outer peripheral frame and another end in the second direction coupled to the first and second coupling portions.

4. The lead frame of claim 1, wherein the deformation restraining portion includes;
a first deformation restraining portion that couples the first leads to the outer peripheral frame such that the first coupling portion crosses the first leads, wherein the first deformation restraining portion is provided such that the first deformation restraining portion is closer to the external connection ends of the first leads with respect to the first coupling portion in the second direction; and
a second deformation restraining portion that couples the second leads to the outer peripheral frame such that the second coupling portion crosses the second leads, wherein the second deformation restraining portion is provided such that the second deformation restraining portion is closer to the external connection ends of the second leads with respect to the second coupling portion in the second direction; and
the intermediate portion further couples the first deformation restraining portion to the second deformation restraining portion.

5. An electric power converting device, comprising:

the lead frame of claim 1 wherein the first coupling portion, the second coupling portion, the intermediate portion and the deformation restraining portion has been cut away;

a first semiconductor element that is provided on the first island and is connected to the semiconductor element connection ends of the first leads; and a second semiconductor element that is provided on the second island and is connected to the semiconductor element connection ends of the second leads.

6. A semiconductor apparatus, comprising:

the electric power converting device of claim 5; and a controller that is connected to the external connection ends of the first and second leads.

7. A method of manufacturing a semiconductor apparatus, the method comprising:

providing the lead frame of claim 1, installing a first semiconductor element and a second semiconductor element on the first and second islands of the lead frame, respectively, connecting the semiconductor element connection ends of the first leads to the first semiconductor element and the semiconductor element connection ends of the second leads to the second semiconductor element, molding a resin on the lead frame such that the external connection ends of the first and second leads are exposed while pressing the first and second coupling portions with a mold; and cutting away the first coupling portion, the second coupling portion, the intermediate portion and the deformation restraining portion.

8. The lead frame of claim 1, wherein the external connection end of each of the first leads is plated and the external connection end of each of the second leads is plated.

\* \* \* \* \*